United States Patent
Buoli et al.

(10) Patent No.: US 6,326,857 B1
(45) Date of Patent: Dec. 4, 2001

(54) MICROWAVE VOLTAGE CONTROLLED OSCILLATOR FORMED AND LOCATED ON A HIGH DIELECTRIC LOSS SUBSTRATE WITH A CONTROLLED CIRCUIT

(75) Inventors: Carlo Buoli, Mirandola; Giovanni Mora, Fontanella, both of (IT)

(73) Assignee: Siemens Inofmraton and Communication Networks S.p.A., Milan (IT)

( * ) Notice: Subject to any disclaimer, the term of this patent is extended or adjusted under 35 U.S.C. 154(b) by 0 days.

(21) Appl. No.: 09/446,741

(22) PCT Filed: Jun. 24, 1998

(86) PCT No.: PCT/EP98/04028

§ 371 Date: Feb. 10, 2000

§ 102(e) Date: Feb. 10, 2000

(87) PCT Pub. No.: WO99/00892

PCT Pub. Date: Jan. 7, 1999

(30) Foreign Application Priority Data

Jun. 27, 1997 (IT) .............................................. MI97A1522

(51) Int. Cl.[7] ...................................................... H03B 1/00

(52) U.S. Cl. ................. 331/96; 331/108 C; 331/117 FE; 331/107 SL; 331/96; 331/99; 331/117 D; 331/117 R; 257/275

(58) Field of Search ........................... 331/96, 99, 117 R, 331/108 C, 107 SL, 117 D, 117 FE; 257/275

(56) References Cited

U.S. PATENT DOCUMENTS

| | | | |
|---|---|---|---|
| 4,677,396 | 6/1987 | Cruz et al. | 331/117 R |
| 5,115,210 | 5/1992 | Cummings et al. | 331/99 |
| 5,187,451 | 2/1993 | Nakamoto et al. | 331/99 |
| 5,532,651 | 7/1996 | Jager et al. | 331/96 |
| 5,705,966 | 1/1998 | Carmi | 333/219 |
| 6,130,640 | * 10/2000 | Uematsu et al. | 342/175 |

* cited by examiner

Primary Examiner—Arnold Kinkead

(57) ABSTRACT

A voltage controlled oscillator formed as a first layout with metallized areas by a planar technique is located on a high dielectric loss substrate. A second layout formed of metallized area for control circuits of the voltage controlled oscillator is formed on a high loss dielectric substrate is also formed by the same technique as the first layout. A ground plane for the controlling oscillator is formed on an opposite side of the dielectric substrate on which the voltage controlled oscillator is formed.

16 Claims, 3 Drawing Sheets

MICROWAVE VOLTAGE CONTROLLED OSCILLATOR FORMED AND LOCATED ON A HIGH DIELECTRIC LOSS SUBSTRATE WITH A CONTROLLED CIRCUIT

This application is the national phase under 35 U.S.C. §371 of PCT International Application No. PCT/EP98/04028 which has an International filing date of Jun. 24, 1998 which designated the United States of America.

FIELD OF THE INVENTION

The present invention relates to the microwave oscillator field, and more in particular to a voltage controlled microwave oscillator (VCO) implemented by a planar technique on a high dielectric loss substrate.

Microwave oscillators are universally employed in professional telecommunication equipment, such as for instance radio links or satellite transponders, as local oscillators for frequency converters. As known, the particular local oscillator frequency determines, in transmission, the conversion of an IF signal at the center band frequency of the channel one intends to transmit; dually in reception, it determines the IF conversion of the channel one intends to receive. Therefore, it is important to be able to act without difficulty on the local oscillator to vary the channel selection, even during the normal operation of the equipment. Voltage controlled oscillators, or VCO, offer this possibility since the oscillation frequency is determined by a control voltage applied to a varactor.

BACKGROUND ART

In the manufacturing of microwave oscillators a planar technique is generally employed, based on the deposition of conductive films in predetermined areas of a dielectric substrate forming a microstrip circuit layout, on which discrete active and/or passive components shall be installed, completing the oscillator circuit. Universally adopted substrates are those presenting low dielectric losses at the highest use frequencies, such as for instance: alumina, quartz, glass, etc., since they do not significantly attenuate the signals crossing the microstrip, making thus easier to obtain the circuit layouts.

The parameter defining dielectric losses in a substrate is the tan. δ. also:

$Q = 1/\tan. \delta.$

High dielectric loss substrates, such as for instance vetronite ones, that is a thin glass fiber laminate soaked with epoxy resins and copper plated on one or both the sides (the standard definition is glass reinforced FR4), are on the contrary generally used in the manufacturing of electronic circuits, operating at considerably lower frequencies compared to microwaves, for instance in the manufacturing of a traditional printed circuits.

For vetronite tan. δ=0.025–0.05 whereas for alumina tan.δ.=0,0001.

The comprehension of the boundaries of the application fields of the two substrate typologies is facilitated by the fact that, if one wants for instance to employ the standard glass reinforced FR4 substrates in a microwave environment, these will attenuate the signals too much, preventing in practice the realization of the layouts; on the contrary, when alumina substrates are used at the lowest frequencies, even if possible in itself, it should not be possible to obtain the same advantages as the standard glass reinforced FR4, in terms of easy handling of the product and simple manufacturing process. There is of course the exception, represented by a frequency interval, which includes the first microwaves where the selection between the two kinds of substrates is not so well defined.

In general, we can assert that as the frequency increases, the manufacturing process shall have ever-restricted tolerances since it is necessary a width of the lines or gap among these last lower than 100 μm. This involves a higher definition of line edges available and a better regularity of the same.

Another restriction is due to the installation of components, which in presence of higher frequencies shall have a better accuracy on the positioning of the components themselves to assure the required repeatability in the testing step.

It is necessary to consider the fact that a Microwave VCO used as local oscillator is generally inserted in a phase locked loop, or PLL, for the implementation of the frequency synthesis in the channel selection. The operation of a PLL is known, the emphasis here, is that it includes dividers of the VCO frequency and devices operating at a frequency lower than the microwaves one.

The parameters characterizing a VCO are selected in the design phase since they depend on the application of the VCO itself. In general, it is known that if the Q is high, the phase noise close to the carrier is very good (that is low). However, on the other hand, there is a narrow operation bandwidth (100 MHz). If on the contrary, the Q is low the phase noise is worsened, but a broader operation band is obtained. However, in alumina Q=200 (it depends almost only on the line steel) while in FR4 Q=20–40 with worsening of the phase noise of about 10 dB.

In the engineering practice, the integration of microwave circuits with lower frequency circuits requires the use of sealed mechanical housing to envelope microwave circuits, to avoid the electromagnetic power irradiation in the surrounding space and ensuing malfunctions of the remaining circuits. This involves significant production costs due to:

Accuracy mechanics of the mechanical housing;
The anchoring system of the same to the substrate housing the circuits at lower frequency;
The need to provide coaxial cables fit with terminal connectors for the entering and/or withdrawal of radio frequency signals in/from the microwave modules;
The need to provide appropriate guide/microstrip transitions for the above mentioned signals;
and finally to the particular means supplying the electric power to the microwave modules.

In summary, this is the current state of the technique in the field of the invention, which as noted above, requires two different techniques to produce:

the microwave structure, typically the VCO whose oscillation frequency can be driven up to 18 GHz, which is produced through deposition of conductive films on an alumina substrate;
the lower frequency structure and typically consisting of locking circuits of the VCO and of bias circuits of all the components, including the components through which the VCO itself is made, which is manufactured, for cost saving purposes, using a standard glass reinforced FR4 substrate.

In the following description, this low frequency structure, consisting of the above mentioned locking circuits and of the above mentioned bias circuits is defined in short "control circuits".

A microwave oscillators of the known type, i.e. a VCO based on the deposition of conductive films in predetermined areas of a dielectric substrate presenting low dielectric losses at the highest use frequencies and the other circuit portions on a glass epoxy substrate is disclosed in U.S. Pat. No. 5,187,451.

This Patent in fact discloses a voltage control circuit (VCO) having a resonant circuit of the microstrip line whose line width and line length are minimised.

The VCO operating at an oscillation frequency of 900 MHz, wherein the resonant portion is configured with a high conductivity conductor on a low dielectric loss, e.g. alumina ceramic dielectric substrate, and the other circuit portions may be on a glass epoxy substrate.

In particular FIG. 2(a) of this patent shows a microstrip line 1 of the resonant circuit b constituted by forming a conductor over a low dielectric constant substrate such as an alumina substrate 2 (see column 4 lines 50 to 54).

OBJECTS OF THE INVENTION

The present invention has the object to reduce the high production costs and the complexity of the circuit modules comprised in a Microwave VCO realized in planar technology.

SUMMARY OF THE INVENTION

The frequency of the oscillation generated by the VCO according to the present invention can be driven up to 18 GHz without significantly degrading the operation performance of the same. This enables a drastic saving of production costs of circuit modules housing a VCO and the relevant control circuit. In fact, for the manufacturing of said modules, now it is no more necessary to have recourse to two different technologic processes, as it occurred in the known art. In view of the new teachings, it is now possible to have recourse to a unique deposition process of a global layout on a unique standard dielectric substrate, highly facilitating the application of automatic mounting techniques of discrete components (Surface Mounting Technology).

In other words the layout is obtained through the same manufacturing process and on a same standard glass reinforced FR4 substrate, on which the lower frequency circuit layout controlling the VCO is obtained.

The deriving advantage is to obtain just from now a unique product, easy to handle and with high repeatability, low cost, and with a considerable reduction of working times. Without departing from the scope of the invention, of course it is possible to implement the VCO on a first standard glass reinforced FR4 substrate, and the control circuits on a second standard glass reinforced FR4 substrate and then proceed to their interconnection.

The thing clearly resulting from the comparison between the state of the art and the subject invention is that this last overcomes the technical prejudice against the use of standard glass reinforced FR4 substrates in the realization of microwave circuits up to 18 GHz. This required great conception and design efforts, in view of a continuous improvement of products and in the attempt to reduce the production costs of the same. These efforts are aimed at facing the limits of physical realization of the high frequency layouts, intrinsically introduced by the material of the substrate both on the circuit operation and on the implementation process of the same: that is, the high losses and the difficulty to incise very narrow conductive pattern having even thickness. High losses are of course a great handicap that was overcome in the subject invention reducing the extension of the VCO layout beyond reasonably conceivable limits, as it will be more apparent from the comparison below, of a conventional VCO with a VCO according to the invention.

An additional considerable simplification in the module housing the Microwave VCO and the relevant control circuits comes from the experimental datum that has not detected any considerable electromagnetic interference on the lowest frequency circuits from the microwave circuits, which made unnecessary the use of a mechanical housing only for the VCO, as suggested by the conventional embodiments.

From the studies conducted by the inventors, it resulted in fact that a high dielectric loss substrate attenuates possible multiple reflections or resonance in the operation band, due to air couplings tied to the type and the mechanical size of the steel receptacle where the same substrate is housed. In short, to minimize these undesired effects with alumina substrates, it is necessary that the steel structure housing the circuit has a comparatively small size in respect with the wavelength of the operation frequency. In case of standard glass reinforced FR4 substrates this is not necessary because it is the dielectric itself that acts as attenuator for the undesired resonance mentioned above.

BRIEF DESCRIPTION OF THE DRAWINGS

The invention, together with further objects and advantages thereof, may be understood with reference to the following detailed description of an embodiment of the same, taken in conjunction with the accompanying drawings, in which.

Figure 1:
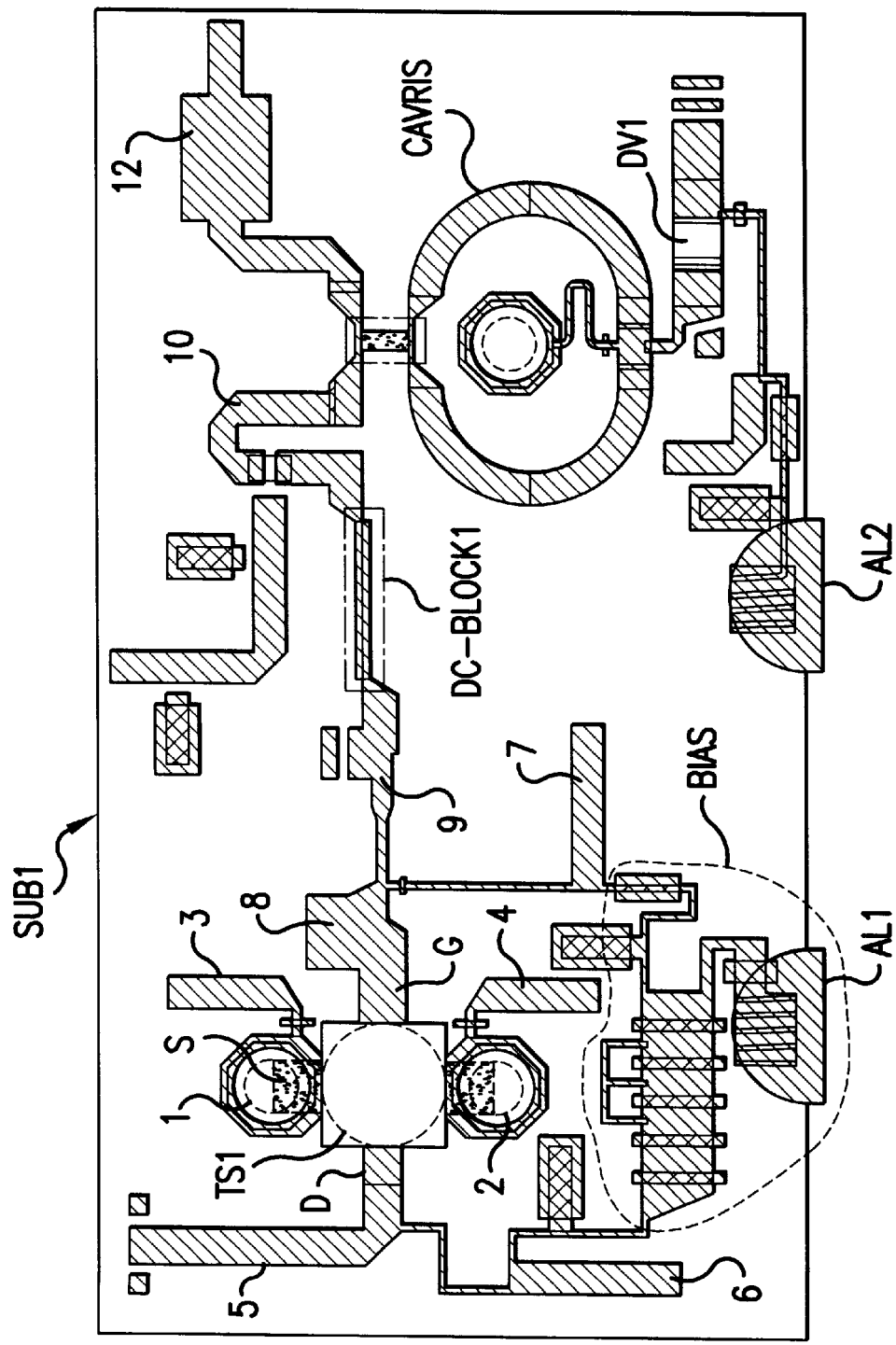
FIG. 1 shows a VCO at the rated frequency of 9 GHz on an alumina substrate implemented according to the known art.

Making reference to FIG. 1 we notice an alumina substrate SUB1 on the front side of which we can see the microstrip layout of a conventional microwave VCO. The substrate includes two metallized holes 1 and 2 whose metallization joins without continuity solution with a uniform metallization on the rear side acting as ground plane for the circuit on the front side. For description convenience, hereinafter in FIG. 1, a direction parallel to the imaginary line connecting the center of holes 1 and 2 is called vertical, and a direction perpendicular to it, is called horizontal. Between the two holes 1 and 2, a GaAsFET TS1 is placed, whose source electrode S shows two opposite terminals, respectively welded to the steel edges of said holes 1 and 2. Gate G and drain D electrodes of TS1 are welded to two relevant microstrips 8 and 5 that in a short starting length are horizontal, afterwards the 5 goes on in vertical direction and the 8 suffers a sharp widening of its cross section. The edges of holes 1 and 2 are also connected to two identical lengths of vertical line 3 and 4. The GaAsFET TS1 is biased by a BIAS network connected to a supply pad AL1 and to two lengths of line 6 and 7, respectively connected to the drain D and gate G of TS1 through microstrips 5 and 8. The widened length of the microstrip 8 is connected to a short, horizontal microstrip 9, having lengths of different cross section, connected in its turn to an end of a direct current block device DC-BLOCK1 consisting of two coupled narrow lines, horizontal they too. The other end of DC-BLOCK1 is connected to an end of a line 10, upside-down U shaped, whose second end is connected to an interdigitated capacitor 12, which jointly with a varactor DV1 and a microstrip CAVRIS of almost circular shape, forms the resonant cavity of the VCO. The varactor DV1, external to the CAVRIS microstrip, is connected between this last and a pad AL2 supplying the bias voltage to the varactor DV1 itself. The microstrip 12 is connected to the line 10 through a short horizontal length, continuing in a vertical length, to regain the horizontal position suffering a sharp section widening and then a return to the previous size. The VCO of FIG. 1 is placed inside a mechanical housing interfacing with its own control and supply circuit (obtained on a glass fiber reinforced plastic substrate and not visible in FIG. 1) in the way described in the introduction.

The operation principles of the VCO of FIG. 1 are known to those skilled in the art.

The thing to notice here is that the shape of the layout seems already optimized as for the minimization of the space occupied on the substrate. To this purpose, we must recall that in the known examples of VCO on alumina, a resonant cavity is always present, to the purpose to improve the selectivity of the oscillator and reduce the phase noise of the generated oscillation.

Now then, from the tests made in the laboratories of the inventors, it resulted that the layout of FIG. 1 transferred as it is on standard glass reinforced FR4 cannot operate since its extension, though minimum for alumina, still results too high in accord to the losses of this new type of substrate at the use frequencies of the VCO.

Figure 2:
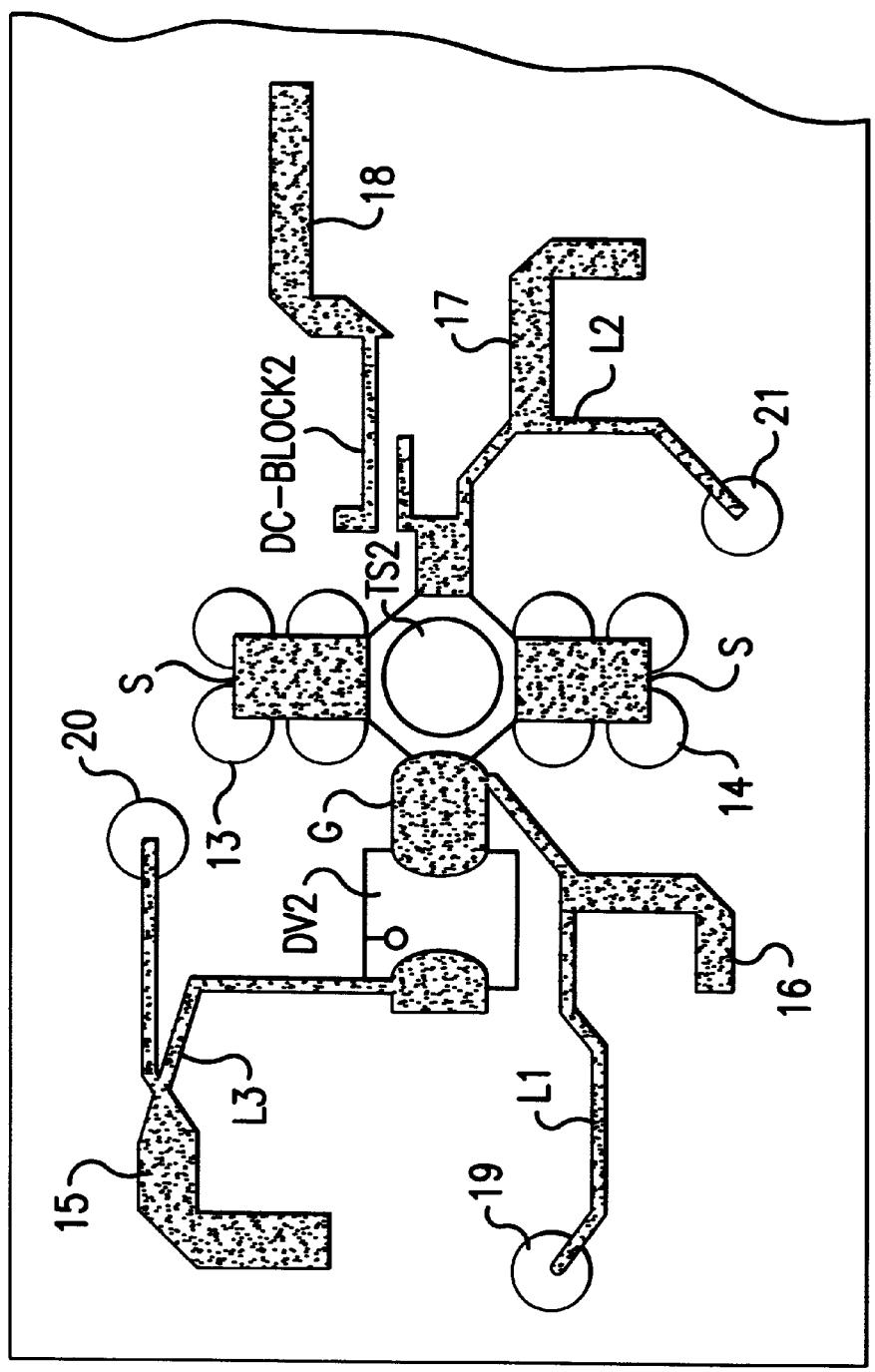
FIG. 2 shows VCO at 15 GHz rated frequency on vetronite implemented according to the subject invention.

As it can be noticed describing FIG. 2, the technical prejudice against the use of the standard glass reinforced FR4 was overcome giving up the resonant cavity together with the relevant dielectric resonator and all the microstrips connected to the same, taking also particular design measures for the remaining portion.

Concerning the absence of the resonant cavity, it must be noticed that in the subject applications, broad operation bands are requested (1.5 GHz), then, low Q and worst phase noise, but being the Microwave VCO locked to a VCO UHF with high Q, success was achieved in obtaining a considerable reduction of the phase noise.

The result has been a new layout on the standard glass reinforced FR4 substrate of considerably reduced extension, at equal rated frequency, compared to the one in FIG. 1, capable to operate giving a performance only a little bit lower and in any case more than noteworthy. Up to now, this drastic simplification did not seem to be logical to the field technician, indeed, the mentioned background art corresponds to a Microwave VCO produced by the same inventors.

Making reference to the invention shown in FIG. 2, note that the front side of a standard glass reinforced FR4 substrate SUB2, of the multilayer type, on which a microstrip layout of a microwave VCO according to the present invention is visible. The visible substrate in FIG. 2 is only a part of the whole substrate SUB2, which includes also an additional layout of the low frequency circuits of the VCO. The substrate includes eight metallized holes two identified as 13 and 14 whose metallization joins without continuity solution to a uniform metallization placed on the rear side of the first layer, having ground plane functions for the circuit visible on the front side. Between holes 13 and 14 a GaAsFET TS2 is placed, whose source S electrode shows two opposite terminals, respectively welded to the steel edges of holes 13 and 14. The gate G and drain D electrodes of TS2 are welded to two respective pads underneath, perpendicular to the imaginary line connecting the center of holes 13 and 14. The gate pad is also welded to a first electrode of a varactor DV2, whose second electrode is connected, through a narrow line L3, to a metallized hole 20 in contact with the layout of a circuit supplying a control voltage for the VCO (not visible in FIG. 2). A stub 15 is placed on line L3, and it has a block function for radio frequency oscillations. In other words, the line L3 and the stub 15 enable the passage of the supply voltage of the varactor DV2 and, at the same time, they have a block function for radio frequency signals that must not reach the supply device.

A bias network of the GaAsFET TS2 (not visible in FIG. 2) is connected through two metallized holes 19 and 21, and two narrow lines L1 and L2, to the gate and drain pads of TS2, respectively. Two relevant stubs 16 and 17 are placed on the lines L1 and L2 at a distance from gate G and drain D electrodes, not greater than $\lambda/4$, $\lambda$ being the wavelength of the oscillation generated by the VCO. The drain pad is connected to an end of a block device for direct current DC-BLOCK2 consisting of two coupled narrow lines, less than $\lambda/4$. The other end of DC-BLOCK2 is connected to a line 18 on which a sinusoidal signal is available, generated by the VCO at 15 GHz frequency.

Concerning the operation, it must be pointed out that at the high frequencies involved, the varactor DV2 has a resonant behaviour in itself, which is additionally emphasized by inductance and parasite capacities of the GaAsFET and by those distributed along the circuit, so that, being the circuit configuration the typical one of an oscillator, it is sufficient to bias TS2 in order to assure a sufficient gain and provide an adequate control voltage on the varactor to cause the starting of the 15 GHz oscillation and the same is selfsupported by TS2. The distance between the electrode of the varactor DV2 and gate G of the GaAsFET TS2 is null, like that between the drain D and the short coupled lines DC-BLOCK2. Furthermore, connection lines L1, L2 and L3 with the remaining non-microwave circuits insisting on the same substrate are protected by stubs, very close to TS2 and DV2 to avoid power losses due to reflection and irradiation caused by a possible impedance mismatching. With these measures, the lines, in addition to the stubs towards the metallized holes, do not create operation problems, irrespective of their length, also because affected by continuous or almost continuous voltage. On the contrary, it is necessary to match the microstrip impedance 18 with the impedance of the circuits placed downstream the VCO, since the 15 GHz oscillation runs on the same and it could be excessively attenuated during the path on the substrate in presence of mismatching.

As a whole, the extension of the layout results being the minimum possible one for a VCO in planar technology. The use of a mechanical housing dedicated to the sole VCO implemented according to the invention is superfluous. However, the presence of a mechanical housing enclosing the VCO with its own control and polarization circuits, as well as additional circuits foreseen on the same substrate, can become necessary for mechanical compactness purposes and residual protection.

Figure 3:
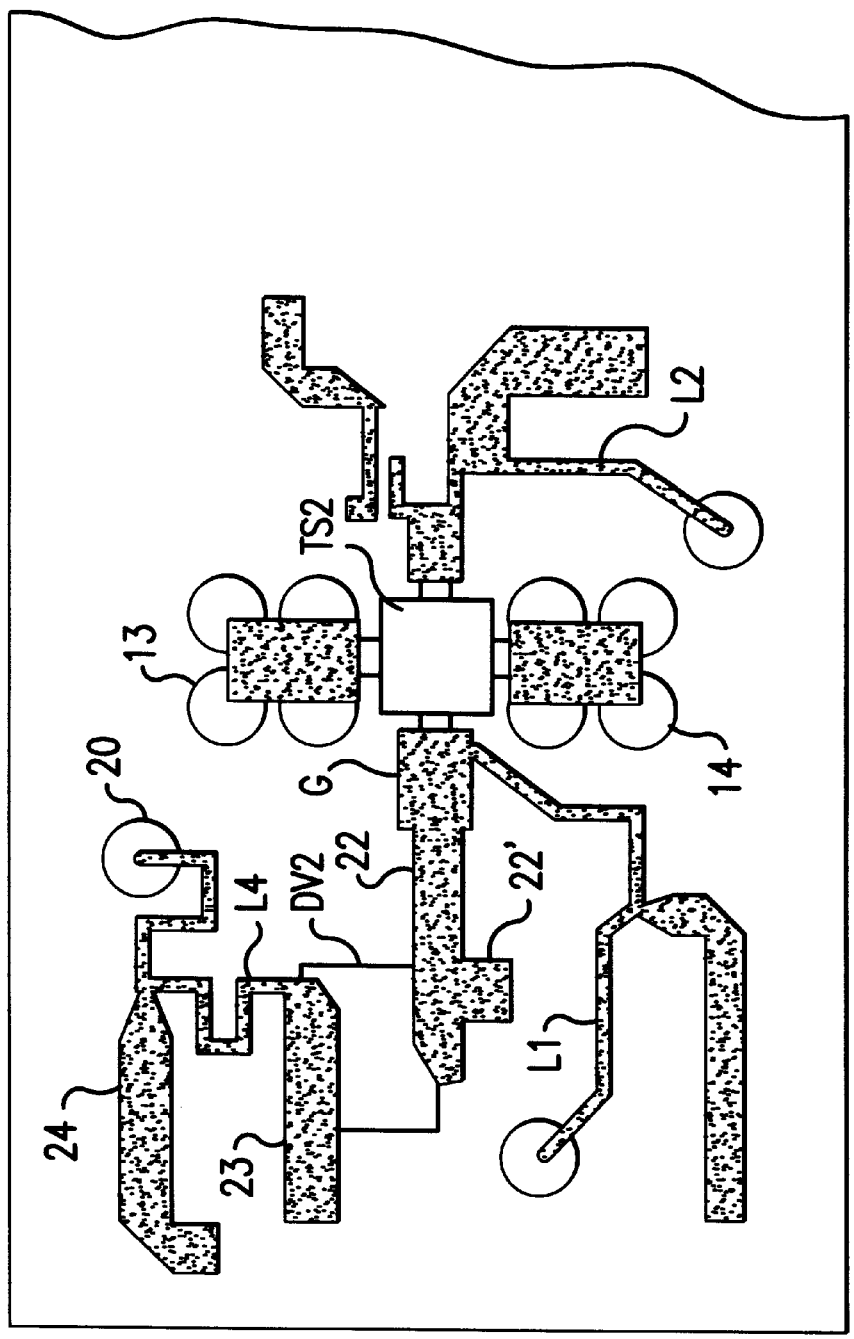
FIG. 3 shows an alternative embodiment of the VCO of FIG. 2.

Making reference to FIG. 3, showing a layout conceived to operate at a frequency different from that of the layout of FIG. 2, where the same elements of FIG. 2 are identified with the same symbols, we can notice that the varactor DV2 is connected to the gate electrode of TS2 through a short line 22 perpendicular to the line that theoretically joins the centres of the steel holes 13 and 14.

In other words the two layouts are different, though always being based on the principle to contain at the most, the length of the lines in order that they are as shorter as possible to take advantage of the whole gain of active devices, being different the operation frequencies of the two VCO and therefore the two layouts have lightly diversified matching networks.

In particular, in this case the varactor is not directly welded on the same pad where the gate electrode of the FET is welded, but the presence of a line 22 is foreseen, having length not higher than 3λ/4 and showing a step widening 22' in its terminal area connected to DV2. The second electrode of the varactor DV2 is directly connected to a stub 23 having direction parallel to the line 22 and length comparable with the same, directed towards the peripheral area of the substrate. The same electrode of DV2 is also connected to the metallized hole 20 through a narrow line L4 along which a stub 24 is placed, parallel to stub 23. Also in this case the block of radio frequency oscillations is assured by the line L4 and by stub 24.

Though the invention is described making reference to two preferred embodiments, it is evident that variants and modifications are possible for the skilled in the art without departing from the ambit of the following claims.

What is claimed is:

1. A microwave voltage control oscillator comprising:
   a first layout supporting metallized areas forming a microwave structure of said voltage control oscillator formed on a dielectric substrate having a high dielectric loss;
   a second layout forming control circuits of said microwave voltage control oscillator operating at lower frequencies compared to microwaves of the microwave structure, formed on the dielectric substrate having high dielectric loss at an operation frequency,
   said microwave voltage control oscillator having an operation frequency of tens of Ghz, and
   said first layout being formed on the same dielectric substrate having high dielectric loss at said operation frequency of said microwave voltage control oscillator.

2. The microwave voltage control oscillator according to claim 1, wherein said dielectric substrate is reinforced glass and said operation frequency of the microwave voltage control oscillator reach 18 GHz.

3. The microwave voltage control oscillator according to claim 1 further including:
   an active element effective to produce oscillations;
   a tuning element directly connected to a gate electrode of the active element, at a distance not exceeding 3λ/4, λ being the wavelength of the oscillation generated by the microwave voltage control oscillator.

4. The microwave voltage control oscillator according to claim 3, wherein said active element consists of a GaAsFET.

5. The microwave voltage control oscillator according to claim 4, wherein a drain electrode of the GaAsFET is welded to a metallized area which is connected to a DC block consisting of two coupled narrow lines having length less than λ/4.

6. The microwave voltage control oscillator according to claim 1, wherein said of dielectric substrate supports a ground plane placed on a side, opposite to a side supporting said metallized areas forming a microstrip circuit layout of said voltage control oscillator and a source electrode of a GaAsFET is welded on at least a metallized pad that is electrically connected to the ground plane through at least a metallized hole.

7. The microwave voltage control oscillator according to claim 1, further including a first and second electrical line having a length less than λ/4, connecting a drain electrode and a gate electrode of the GaAsFET via first and second electrical lines to said control circuit of the voltage control oscillator.

8. The microwave voltage control oscillator according to claim 7, wherein said first electrical line and said second electrical line has a second stub.

9. The microwave voltage control oscillator according to claim 3, wherein an electrode of the tuning element is connected, through a line, to a contact with a layout of a circuit supplying the oscillator control voltage.

10. The microwave voltage control oscillator according to claim 9, wherein said line includes a stub connected thereto.

11. The microwave voltage control oscillator according to claim 5, wherein the DC block has an end to which is connected to a line, on which microwave oscillation is produced.

12. The microwave voltage control oscillator according to claim 3, wherein said tuning element is welded to a same pad where a gate electrode of the active element is welded.

13. The microwave voltage control oscillator according to claim 10, wherein an additional stub is connected to said line.

14. The microwave voltage control oscillator according to claim 1, wherein said dielectric substrate is formed of multi-layers.

15. The microwave voltage control oscillator according to claim 1, wherein a shielding mechanical housing encloses said control circuits.

16. The microwave voltage control oscillator according to claim 1, wherein said dielectric substrate supports a ground plane placed on a side, opposite to a side supporting said metallized areas forming a microstrip circuit layout of said microwave voltage control oscillator and a source electrode of a GaAsFET is welded on at least a metallized pad that is electrically connected to the ground plane through at least a metallized hole.

* * * * *